United States Patent
Foster

(10) Patent No.: US 7,102,216 B1
(45) Date of Patent: Sep. 5, 2006

(54) SEMICONDUCTOR PACKAGE AND LEADFRAME WITH HORIZONTAL LEADS SPACED IN THE VERTICAL DIRECTION AND METHOD OF MAKING

(75) Inventor: Donald Craig Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 200 days.

(21) Appl. No.: 09/932,290

(22) Filed: Aug. 17, 2001

(51) Int. Cl.
H01L 23/495 (2006.01)
H01L 21/44 (2006.01)
H01L 21/48 (2006.01)
H01L 21/50 (2006.01)

(52) U.S. Cl. .............................. 257/673; 257/E23.043; 257/E23.046; 438/108

(58) Field of Classification Search ........ 257/E23.043, 257/E23.046, 673; 438/108
See application file for complete search history.

(56) References Cited

U.S. PATENT DOCUMENTS

| | | | |
|---|---|---|---|
| 3,906,621 A * | 9/1975 | Epple | 29/827 |
| 4,026,008 A * | 5/1977 | Drees et al. | 29/593 |
| 4,283,839 A * | 8/1981 | Gursky | 228/170 |
| 4,711,700 A * | 12/1987 | Cusack | 216/14 |
| 4,987,473 A * | 1/1991 | Johnson | 257/676 |
| 5,270,570 A * | 12/1993 | Westerkamp | 257/666 |
| 5,403,785 A * | 4/1995 | Arai et al. | 29/827 |
| 5,462,624 A | 10/1995 | Kwon | 156/257 |
| 5,466,966 A * | 11/1995 | Ito | 257/666 |
| 5,466,967 A * | 11/1995 | Westerkamp | 257/666 |
| 5,521,429 A | 5/1996 | Aono et al. | 257/676 |
| 5,530,281 A * | 6/1996 | Groover et al. | 257/666 |
| 5,548,890 A * | 8/1996 | Tada et al. | 29/827 |
| 5,557,143 A * | 9/1996 | Seiji | 257/666 |
| 5,656,854 A * | 8/1997 | Westerkamp | 257/666 |
| 5,723,899 A | 3/1998 | Shin | 257/666 |
| 5,808,354 A * | 9/1998 | Lee et al. | 257/666 |
| 5,859,471 A * | 1/1999 | Kuraishi et al. | 257/666 |
| 5,864,173 A | 1/1999 | Fogelson | 257/666 |
| 5,898,213 A * | 4/1999 | Torres et al. | 257/666 |
| 5,904,503 A * | 5/1999 | Frechette et al. | 438/123 |
| 5,929,513 A | 7/1999 | Asano et al. | 257/675 |
| 5,977,630 A | 11/1999 | Woodworth et al. | 257/712 |
| 5,994,768 A | 11/1999 | Fogelson | 257/666 |
| 6,002,164 A * | 12/1999 | Conru et al. | 257/666 |
| 6,008,532 A * | 12/1999 | Carichner | 257/691 |

(Continued)

FOREIGN PATENT DOCUMENTS

DE 19734794 A1 7/1998

(Continued)

Primary Examiner—David E. Graybill
(74) Attorney, Agent, or Firm—Stetina Brunda Garred & Brucker

(57) ABSTRACT

A leadframe, a semiconductor package, and methods of making the same are disclosed. A leadframe includes leads having an inner end segment. A first subset of the leads include a recess in a first surface of the inner end segment. A second subset of the leads include a recess in an opposite second surface of the inner end segment. The first subset leads are in an alternating lateral pattern with the second subset leads such that the recess of adjacent inner end segments are oriented in opposite directions. The recesses separate adjacent inner end segments in a vertical direction, thereby eliminating or reducing a need for horizontal spacing between adjacent inner end segments. In a semiconductor package, a semiconductor chip is electrically connected by a bond wire to the inner end segment of the leads. The bond wire is bonded within the recess of alternating leads.

37 Claims, 12 Drawing Sheets

U.S. PATENT DOCUMENTS

| | | | | |
|---|---|---|---|---|
| 6,025,640 A | 2/2000 | Yagi et al. | | 257/666 |
| 6,046,504 A * | 4/2000 | Kimura | | 257/775 |
| 6,075,284 A * | 6/2000 | Choi et al. | | 257/676 |
| 6,087,204 A | 7/2000 | Fogelson | | 438/123 |
| 6,130,115 A | 10/2000 | Okumura et al. | | 438/124 |
| 6,143,981 A | 11/2000 | Glenn | | 174/52.4 |
| 6,150,709 A * | 11/2000 | Shin et al. | | 257/666 |
| 6,166,430 A * | 12/2000 | Yamaguchi | | 257/666 |
| 6,184,575 B1 * | 2/2001 | Chillara et al. | | 257/692 |
| 6,198,171 B1 | 3/2001 | Huang et al. | | 257/787 |
| 6,225,146 B1 | 5/2001 | Yamaguchi et al. | | 438/123 |
| 6,229,200 B1 | 5/2001 | Mclellan et al. | | 257/666 |
| 6,242,281 B1 | 6/2001 | Mclellan et al. | | 438/106 |
| 6,281,568 B1 | 8/2001 | Glenn et al. | | 257/684 |
| 6,297,543 B1 * | 10/2001 | Hong et al. | | 257/666 |
| 6,337,510 B1 * | 1/2002 | Chun-Jen et al. | | 257/666 |
| 6,353,257 B1 * | 3/2002 | Huang | | 257/704 |
| 6,400,004 B1 * | 6/2002 | Fan et al. | | 257/666 |
| 6,424,023 B1 | 7/2002 | Kim et al. | | |
| 6,424,031 B1 * | 7/2002 | Glenn | | 257/686 |
| 6,429,050 B1 * | 8/2002 | Fritzsche et al. | | 438/123 |
| 6,437,429 B1 * | 8/2002 | Su et al. | | 257/666 |
| 6,455,356 B1 * | 9/2002 | Glenn et al. | | 438/123 |
| 6,483,178 B1 * | 11/2002 | Chuang | | 257/672 |
| 6,501,156 B1 * | 12/2002 | Nakanishi et al. | | 257/666 |
| 6,521,987 B1 * | 2/2003 | Glenn et al. | | 257/684 |
| 6,545,345 B1 * | 4/2003 | Glenn et al. | | 257/676 |
| 6,559,526 B1 * | 5/2003 | Lee et al. | | 257/676 |
| 6,630,729 B1 * | 10/2003 | Huang | | 257/676 |
| 6,642,609 B1 * | 11/2003 | Minamio et al. | | 257/666 |
| 6,674,156 B1 * | 1/2004 | Bayan et al. | | 257/670 |
| 6,730,544 B1 * | 5/2004 | Yang | | 438/110 |

FOREIGN PATENT DOCUMENTS

| | | | | |
|---|---|---|---|---|
| EP | 0794572 A2 | | | 10/1997 |
| GB | 2247988 A | * | | 3/1992 |
| JP | 59129451 A | * | | 7/1984 |
| JP | 59-227143 | | | 12/1984 |
| JP | 59215761 A | * | | 12/1984 |
| JP | 59222951 A | * | | 12/1984 |
| JP | 60-195957 | | | 10/1985 |
| JP | 61170053 A | * | | 7/1986 |
| JP | 62001239 A | * | | 1/1987 |
| JP | 03016250 A | * | | 1/1991 |
| JP | 03024754 A | * | | 2/1991 |
| JP | 03245560 A | * | | 11/1991 |
| JP | 04094564 A | * | | 3/1992 |
| JP | 04162469 A | * | | 6/1992 |
| JP | 05109928 A | * | | 4/1993 |
| JP | 05243464 A | * | | 9/1993 |
| JP | 05315509 A | * | | 11/1993 |
| JP | 05326788 A | * | | 12/1993 |
| JP | 06216191 A | * | | 8/1994 |
| JP | 06216197 A | * | | 8/1994 |
| JP | 06338583 A | * | | 12/1994 |
| JP | 7-312405 | | | 11/1995 |
| JP | 8-125066 | | | 5/1996 |
| JP | 08162598 A | * | | 6/1996 |
| JP | 08227959 A | * | | 9/1996 |
| JP | 8-306853 | | | 11/1996 |
| JP | 9-8205 | | | 1/1997 |
| JP | 9-8206 | | | 1/1997 |
| JP | 9-8207 | | | 1/1997 |
| JP | 9-92775 | | | 4/1997 |
| JP | 10116954 A | * | | 5/1998 |
| JP | 10135399 A | * | | 5/1998 |
| JP | 11260983 A | * | | 9/1999 |
| JP | 3144383 B2 | * | | 3/2001 |

* cited by examiner

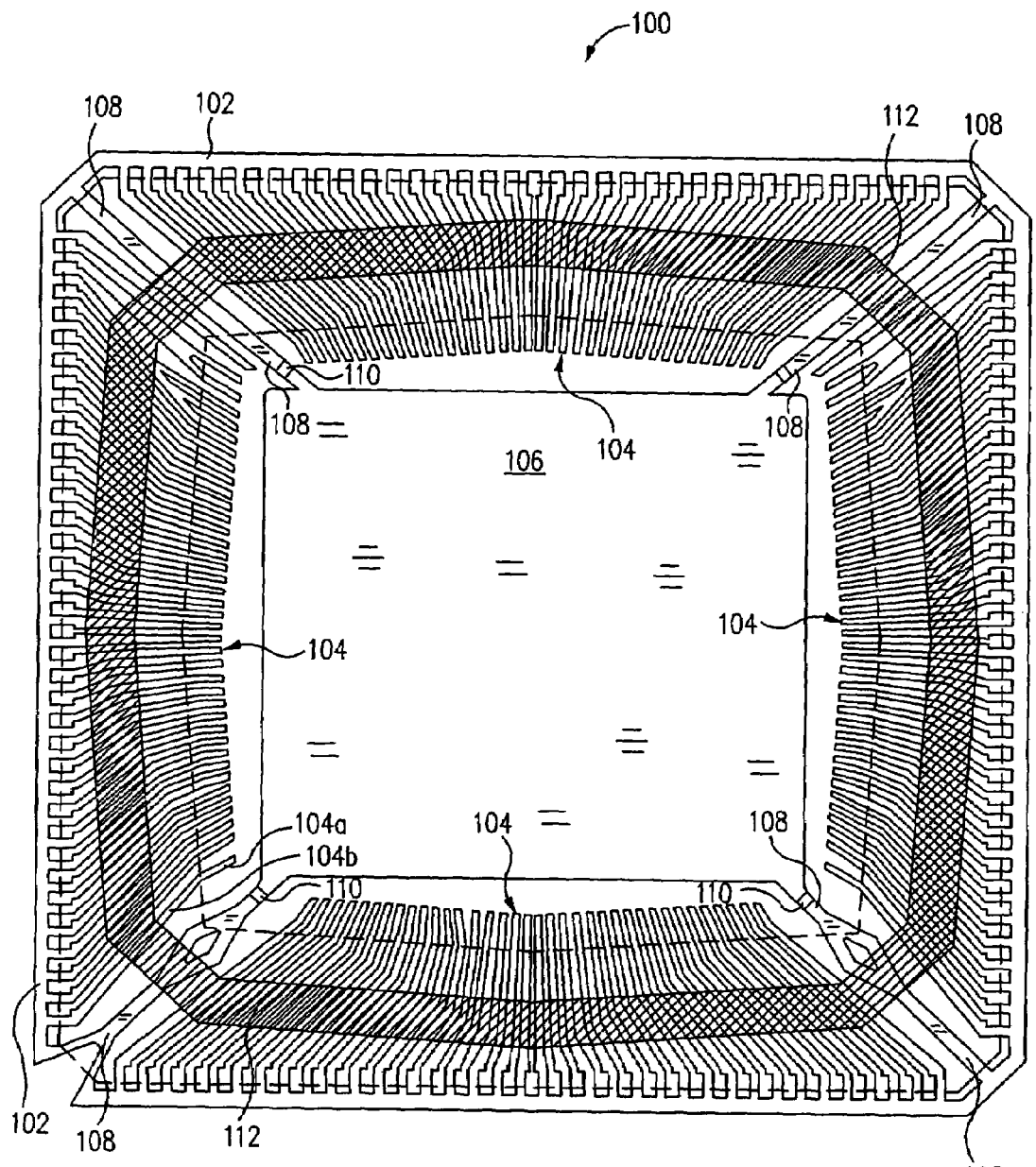
FIG._1

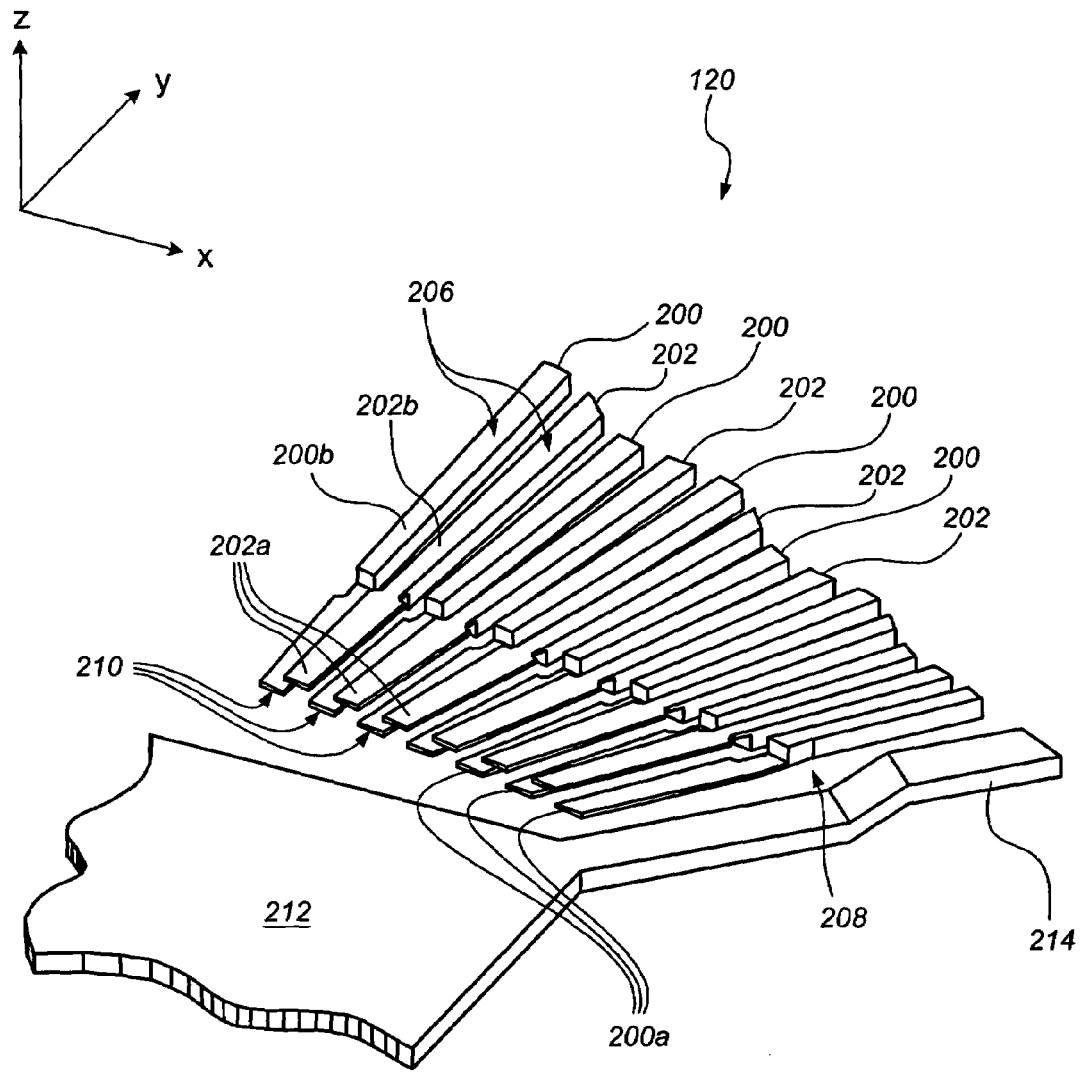
FIG._2A

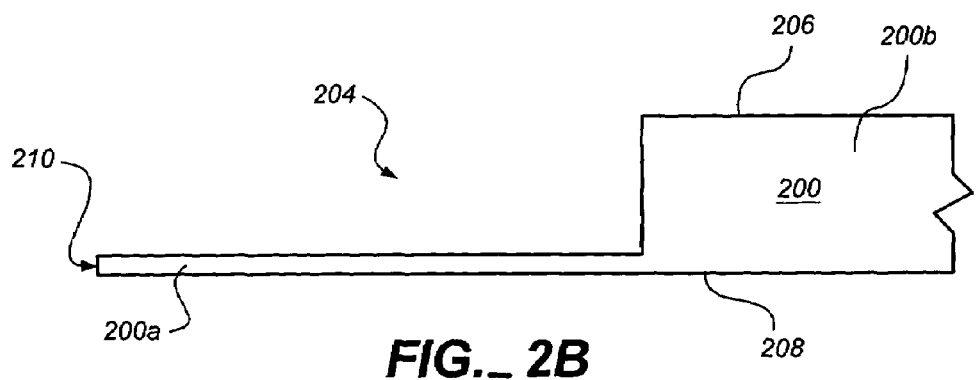
FIG._ 2B
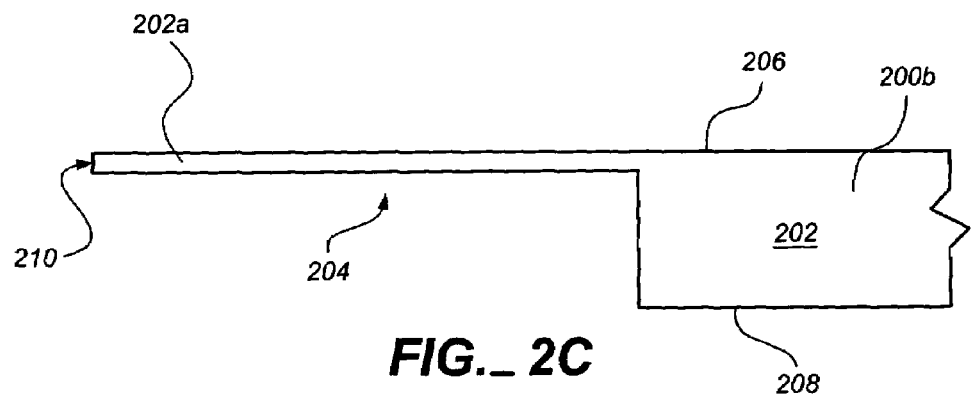
FIG._ 2C
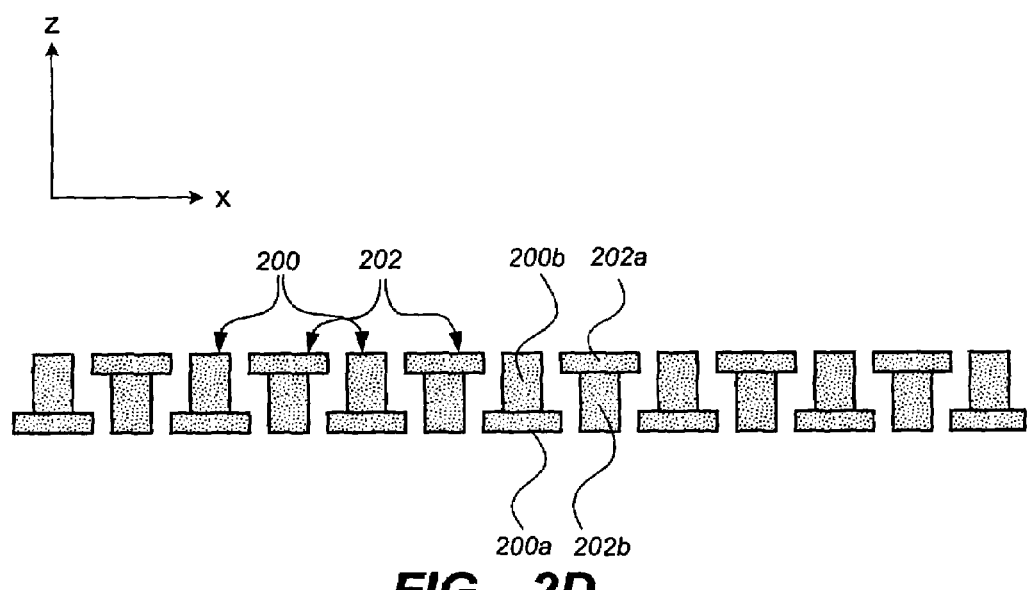
FIG._ 2D

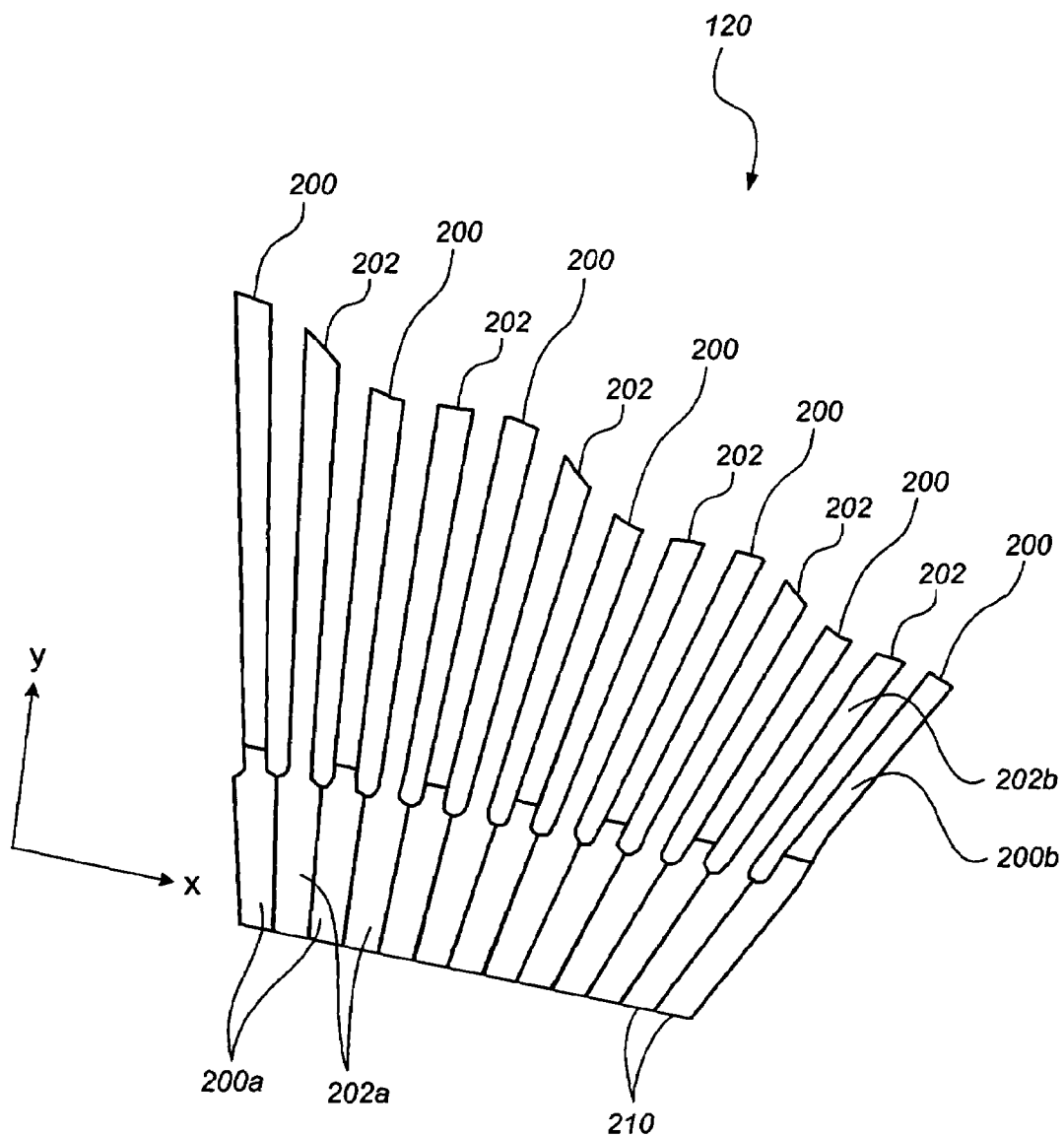
FIG._3

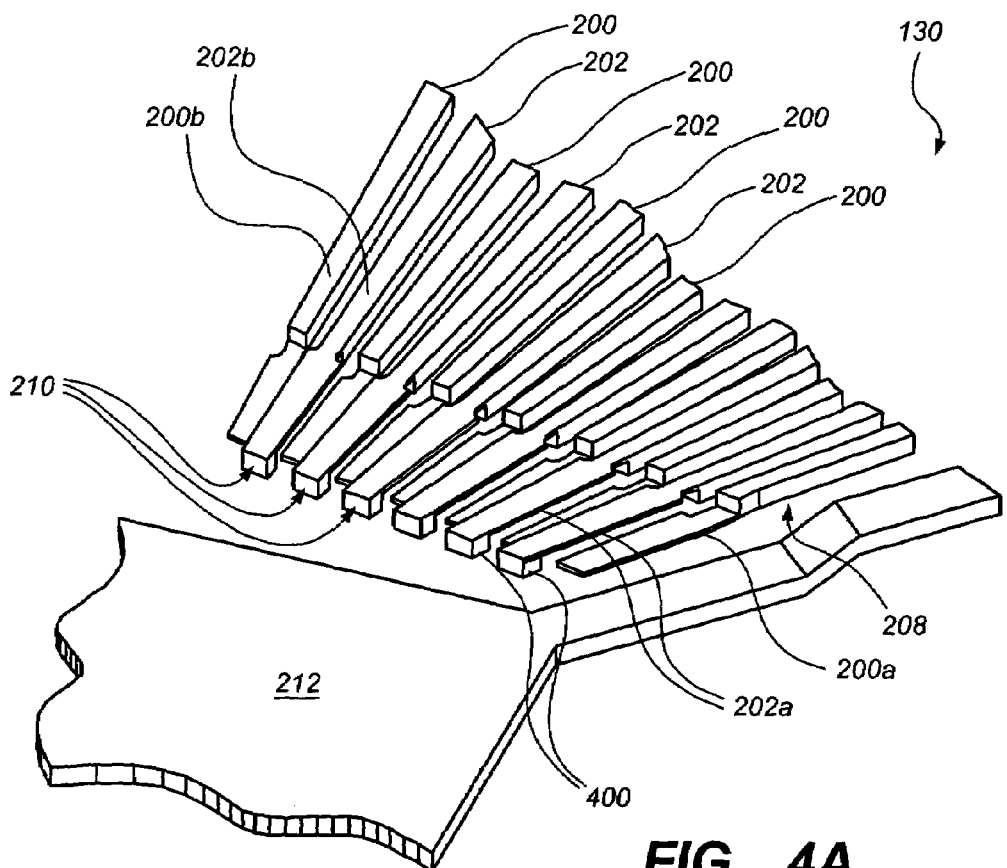
FIG._ 4A
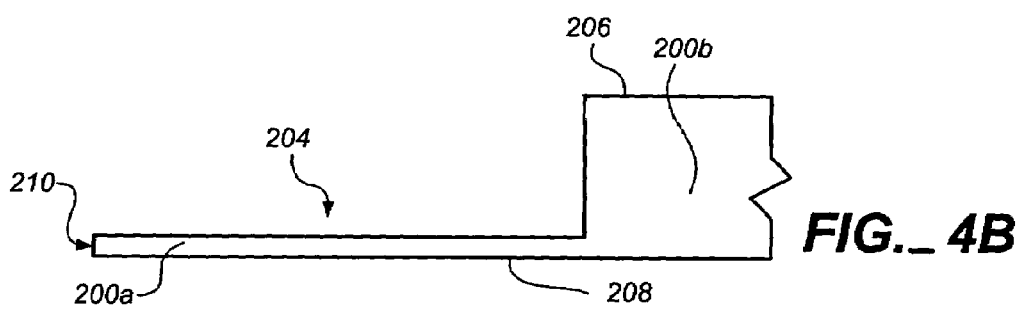
FIG._ 4B
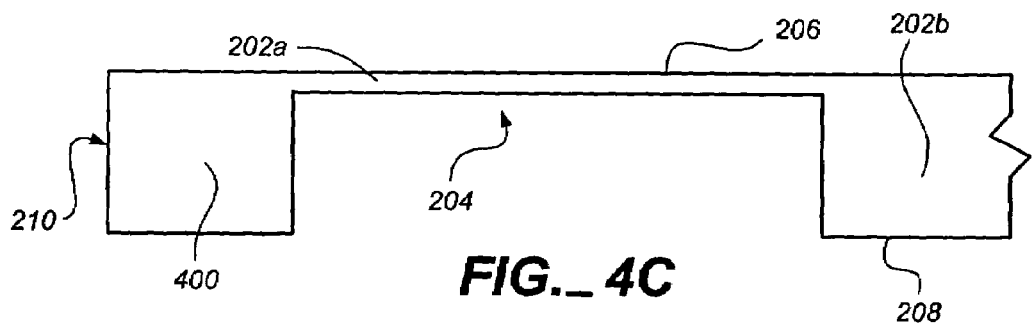
FIG._ 4C

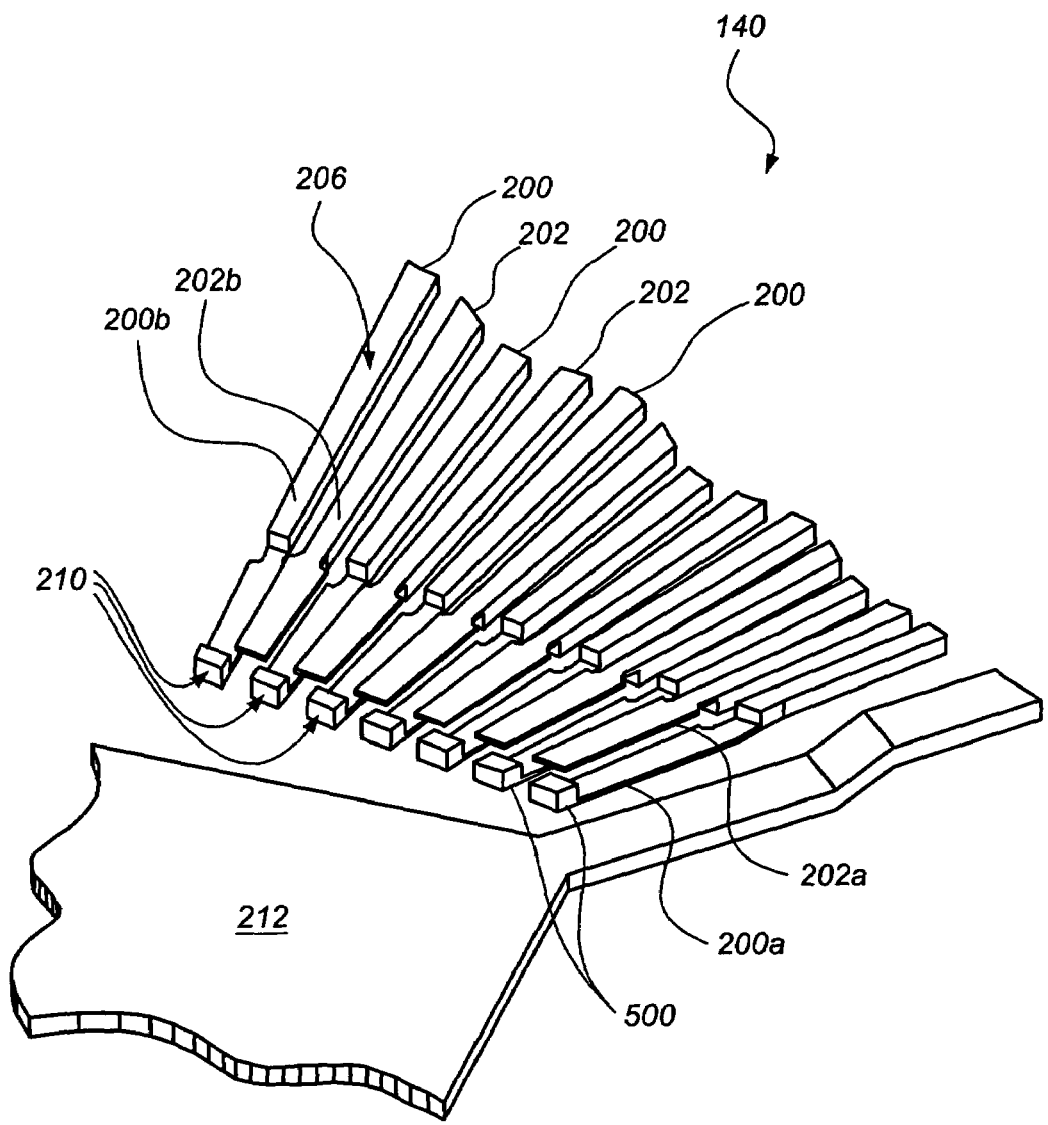
FIG._5

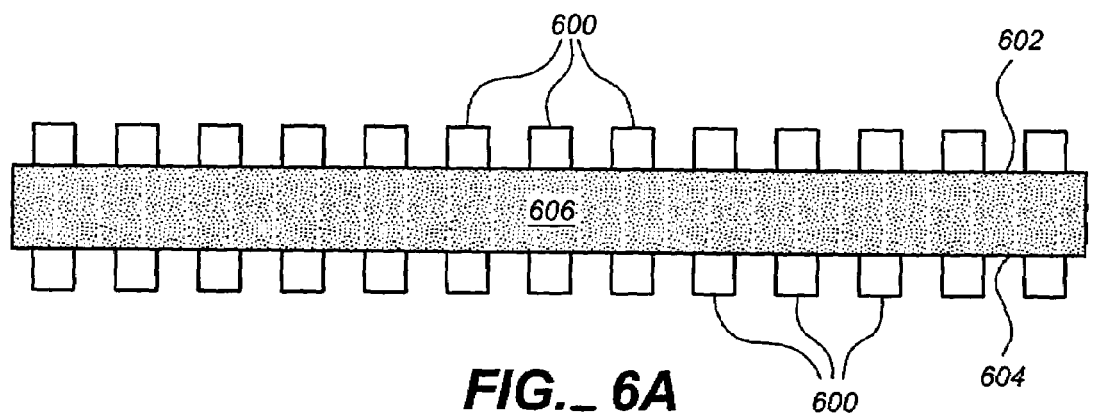
FIG._ 6A
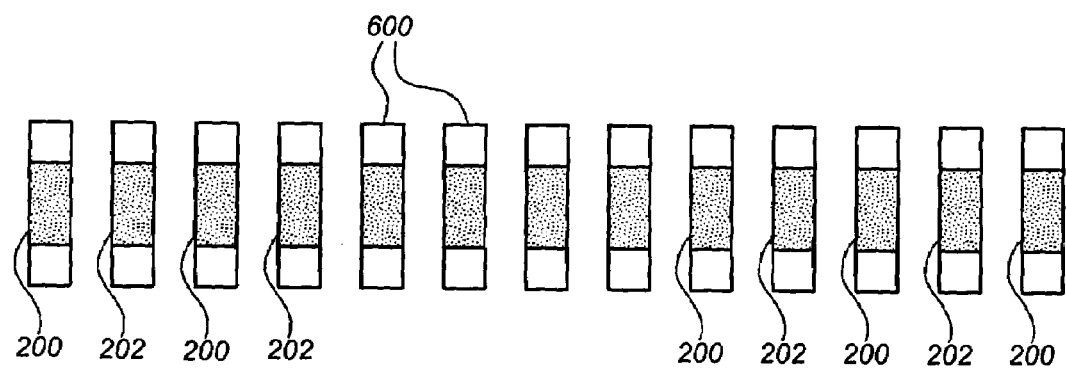
FIG._ 6B
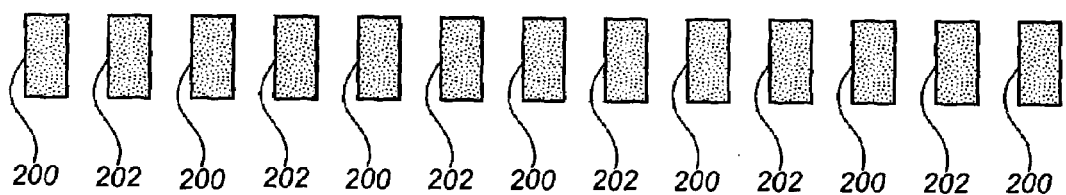
FIG._ 6C

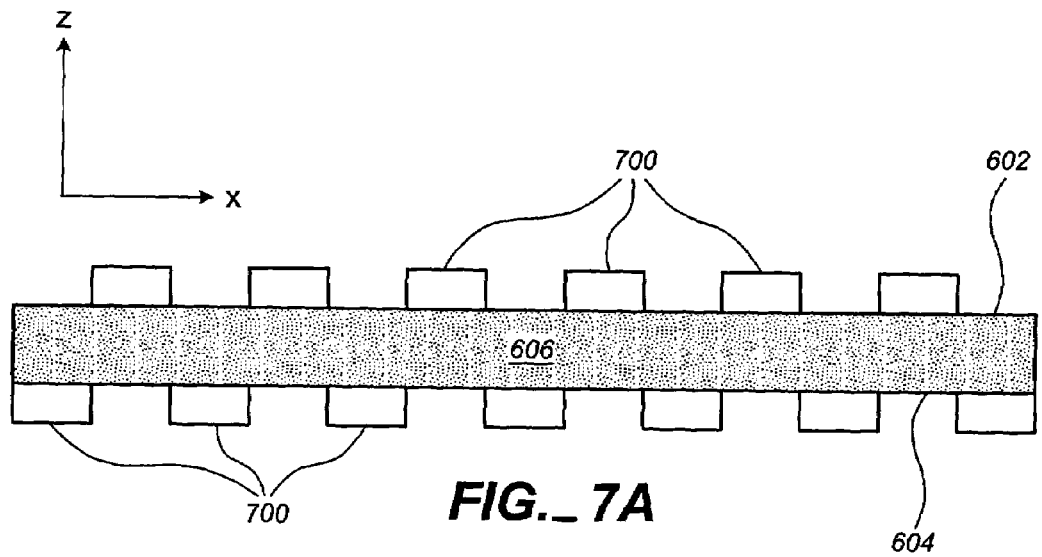
FIG._7A
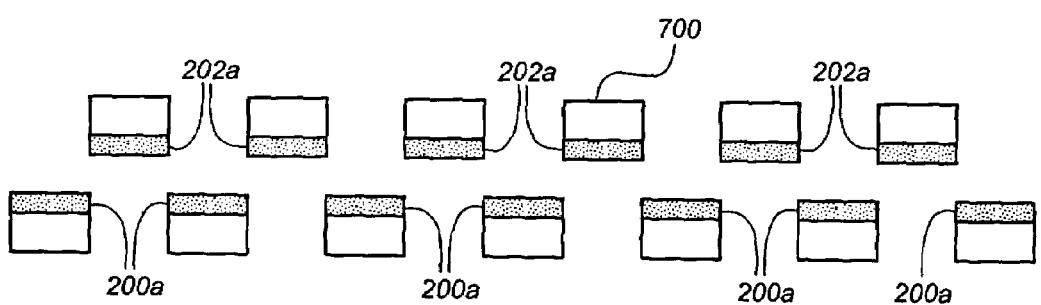
FIG._7B
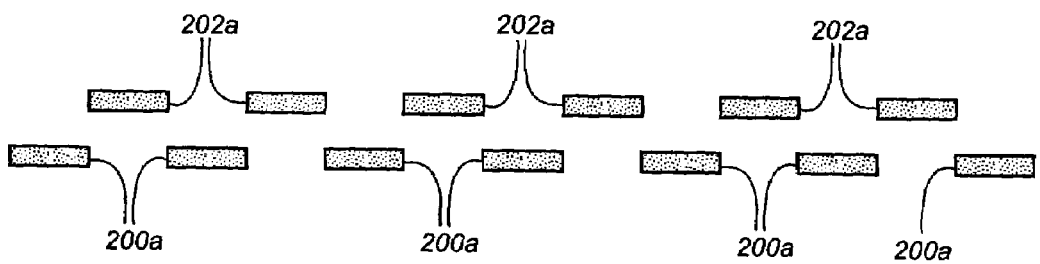
FIG._7C

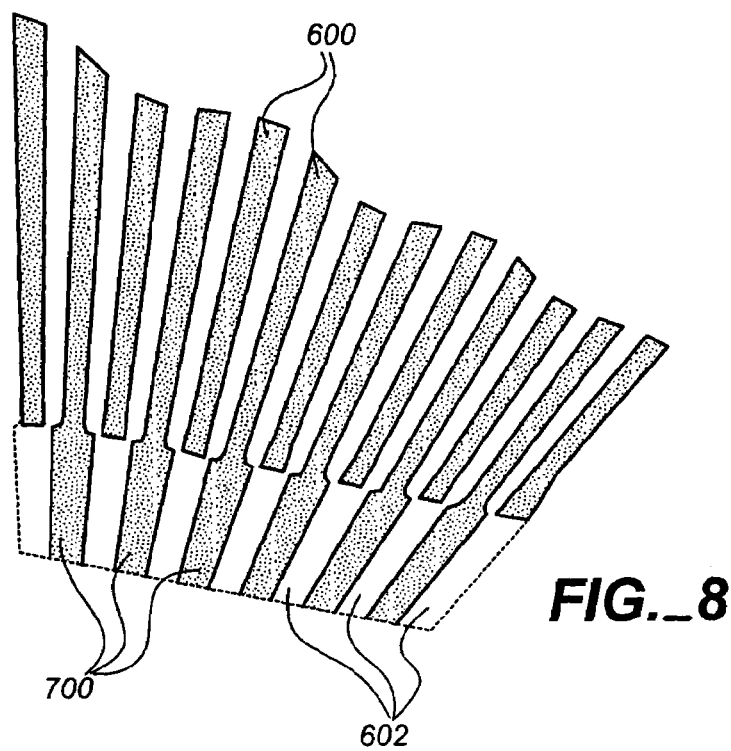
FIG._8
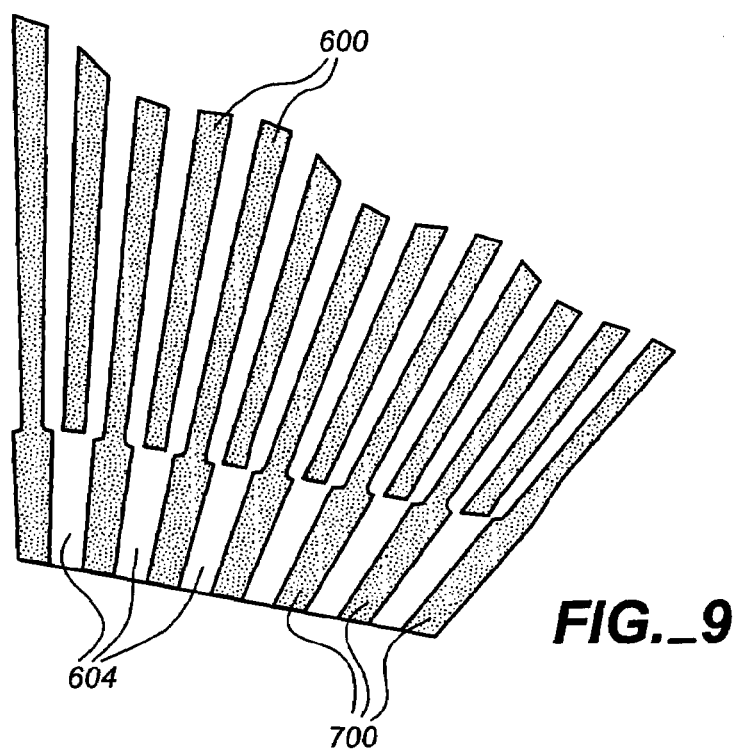
FIG._9

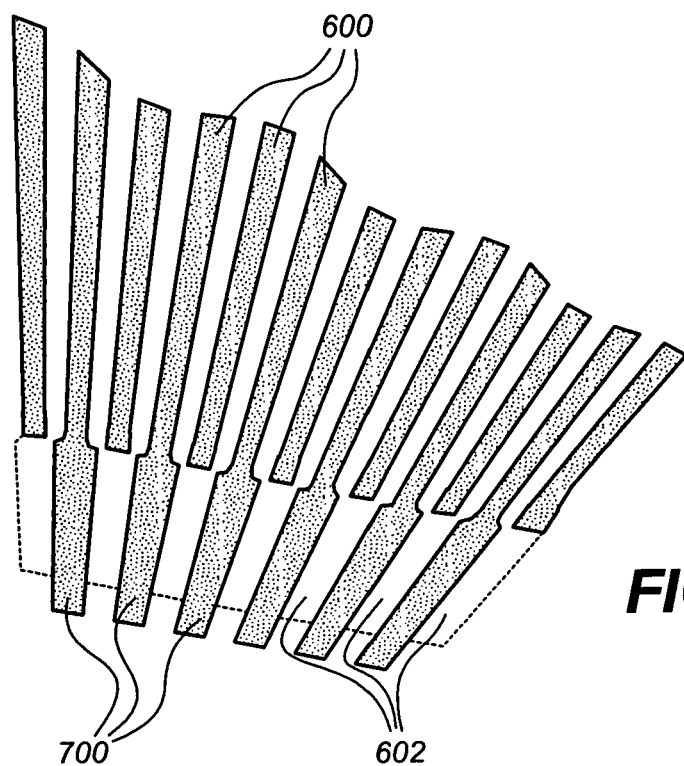
FIG._10
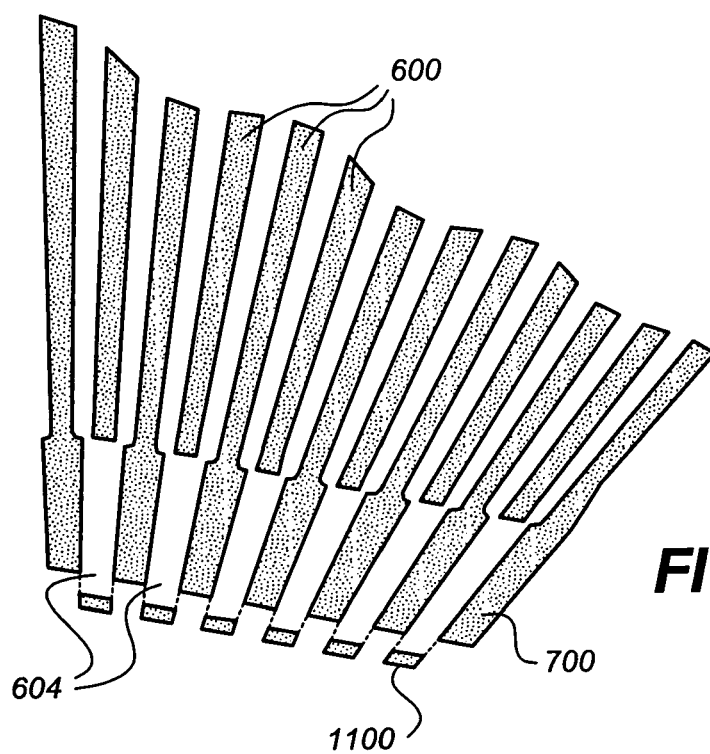
FIG._11

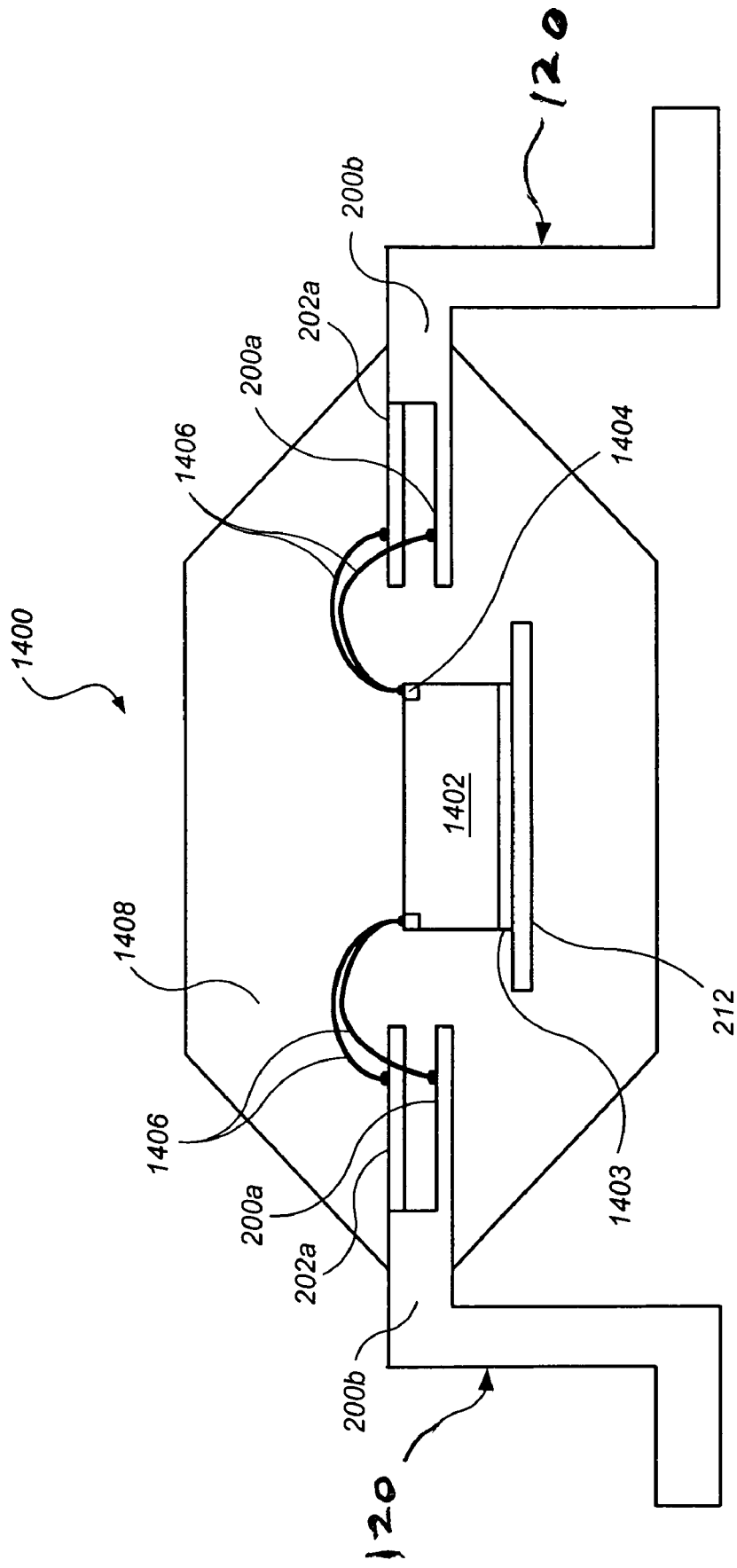

SEMICONDUCTOR PACKAGE AND LEADFRAME WITH HORIZONTAL LEADS SPACED IN THE VERTICAL DIRECTION AND METHOD OF MAKING

BACKGROUND

1. Field of the Invention

The present invention relates to packages for semiconductor chips or other electronic devices, and leadframes for making the packages.

2. Description of Related Art

A typical package for a semiconductor chip includes an internal metal leadframe, which functions as a substrate for the package. The leadframe includes a central die pad and a plurality of leads that radiate outward from the die pad. A hardened, insulative encapsulant material covers the die, die pad, and an inner portion of each of the leads.

The semiconductor chip is mounted on the die pad and is electrically connected to the leads. In particular, the chip includes a plurality of bond pads, each of which is electrically connected by a bond wire or the like to an inner end segment that is at an inner end of one of the leads. An exposed portion of each lead extends outward from the encapsulant, and serves as an input/output terminal for the package.

In the market for semiconductor packaging today, there is a trend toward increased package functionality. This trend includes increasing the number of leads provided in a package. At the same time, there is a trend toward smaller, more compact packages. In keeping with these trends, ever finer leads and inner end segments are required. It can be difficult to meet this industry need while also keeping the cost of the package within reason. Limitations on known methods for making leads and inner end segments, such as chemical etching or mechanical stamping, also makes meeting industry needs difficult, as these methods have inherent limitations as to how fine and dense the leads and the inner end segments can be made. At the same time, the inner end segments must be wide enough to serve as a site for electrical connection to a wire or some other conductor that electrically connects the respective inner end segment to the chip. Accordingly, an improved method of making a leadframe is desirable.

SUMMARY

An exemplary embodiment of the present invention is a leadframe having a plurality of leads, wherein an inner end segment of each of the respective leads is spaced or separated from an adjacent lead or leads by a gap created in the z-direction (i.e., normal to the leadframe surface), rather than in the x-y plane (i.e., the plane in which the leadframe surface lies). Such a configuration may be formed, for example, by using a partial etch method described herein. By separating each lead from the adjacent lead(s) in the z-direction, more leads may be included in the leadframe.

In accordance with another embodiment, a leadframe comprises a plurality of leads, with each lead comprising an inner end segment beginning at an inner end of the lead, the inner end segment including a first surface and an opposing second surface. A first subset of the leads each include a recess in the first surface of the inner end segment. A second subset of the leads each include a recess in the second surface of the inner end segment. Individual leads of the first subset are situated in an alternating lateral pattern with individual leads of the second subset such that the recesses of adjacent inner end segments are oriented in opposite directions. The recesses of at least some of the inner end segments can extend to the inner end of the lead. Further, the recesses of at least some of the inner end segments of either the first subset of leads or the second subset of leads can be set back from the inner end of the lead.

These and other aspects of the present invention will be more apparent in view of the following detailed description of the exemplary embodiments and the accompanying drawings thereof.

BRIEF DESCRIPTION OF THE DRAWINGS

FIG. 1 is a top plan view of a leadframe.

FIG. 2A is a perspective view of a portion of a leadframe constructed in accordance with an embodiment of the invention.

FIG. 2B is a side view of a portion of a lead and an inner end segment from the leadframe illustrated in FIG. 2A.

FIG. 2C is a side view of a portion of another lead and another inner end segment from the leadframe illustrated in FIG. 2A.

FIG. 2D is side view of the inner ends of the leads of FIG. 2A.

FIG. 3 is a top plan view of the leads and inner end segments shown in FIG. 2A.

FIG. 4A is a perspective view of a leadframe including pedestals at the inner ends of alternating leads in accordance with another embodiment of the invention.

FIG. 4B is a side view of a portion of a lead and an inner end segment from the leadframe illustrated in FIG. 4A.

FIG. 4C is a side view of a portion of another lead, another inner end segment, and a pedestal from the leadframe illustrated in FIG. 4A.

FIG. 5 is a perspective view of a leadframe including pedestals for mounting a flip chip in accordance with yet another embodiment of the invention.

FIGS. 6A, 6B, and 6C illustrate a method of forming the leadframe of FIG. 2A in accordance with an embodiment of the invention.

FIGS. 7A, 7B, and 7C illustrate another part of the method of FIGS. 6A–6C.

FIGS. 8 and 9 are plan views of the opposing photoresist masks shown in FIGS. 6A and 7A, respectively.

FIGS. 10 and 11 are plan views of opposing photoresist masks that may be used to make the leadframe of FIG. 4A in accordance with an embodiment of the invention.

FIGS. 12A and 12B are cross-sectional views of various embodiments of semiconductor packages formed through the use of leadframes constructed according to the present invention.

In the drawings, like features are typically labeled with the same reference numbers the various drawings.

DETAILED DESCRIPTION OF THE EXEMPLARY EMBODIMENTS

Figure 12B:
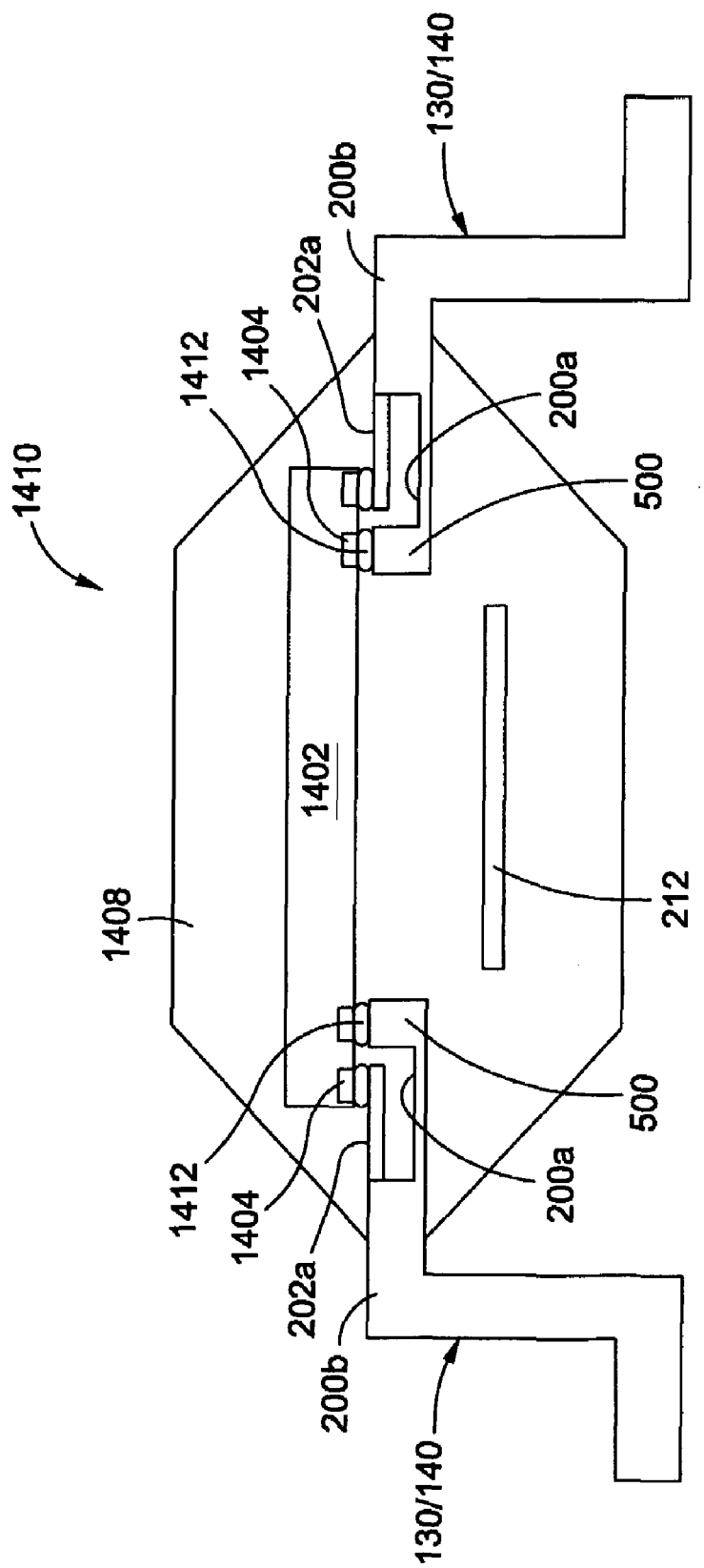

FIG. 1 is a top plan view of a portion of a leadframe 100 that will provide context for the discussion below. Practitioners will appreciate that the techniques of the present invention may be used to make leadframes having a wide variety of configurations. Accordingly, the overall configuration of leadframe 100 is exemplary only.

Leadframe 100 is formed from a metal, such as copper. Other metals also can be used, including, but not limited to, copper alloys, plated copper, plated copper alloys, copper plated steel, Alloy 42, Alloy 37, or any other material that is conductive and can be used for making leadframes. Typically, a plurality of leadframes are formed in a contiguous metal sheet, and the leadframes of the sheet are processed through package assembly as a single unit.

Leadframe 100 includes a closed internal frame, denoted as dam bar 102, that supports a plurality of leads 104 and a planar rectangular die pad 106. Although not shown in FIG. 1, leads 104 may extend outward beyond dam bar 102. The portion of leads 104 within dam bar 102 are encapsulated later in the assembly process.

Die pad 106 is at a central region of leadframe 100 and serves as a base upon which a semiconductor chip is ultimately mounted. Each of the four corners of die pad 106 is connected by a tie bar 108 to dam bar 102. A downset 110 is provided in tie bars 108 so that die pad 106 is vertically below leads 104. Dam bar 102 will be severed from leads 104 and tie bars 108 after an encapsulation step during package assembly, thereby leaving the package with a plurality of encapsulated leads 104 that are electrically isolated from each other.

Leads 104 extend inward from dam bar 102 toward all four sides of die pad 106, as in a quad package. Each lead 104 has an inner end segment, denoted herein as inner end segment 104a, that is proximate to die pad 106, and a longer, outer second portion 104b that is between inner end segment 104a and dam bar 102. In FIG. 1, inner end segments 104a are shown within the dashed line. Ultimately, inner end segment 104a of each of the leads 104 is electrically connected by a bond wire, tab, or some other electrical conductor to the semiconductor chip that is to be mounted on die pad 106 (see, e.g., FIG. 14). Typically, inner end segments 104a of leads 104 are plated with silver or some other common metal to facilitate connection to the bond wire or other conductor that extends to the chip. A nonconductive adhesive strip 112, which may be formed of polyimide, may be applied in a ring onto second portion 104b of leads 104 for stability during processing and to maintain leads 104 at proper positions relative to one another. This can help to prevent two adjacent leads 104 from bending.

As mentioned, leadframe 100 is normally formed from a solid metal sheet that is patterned to create the configuration shown in FIG. 1. Conventionally, the patterning process involves either a chemical etching process or a mechanical stamping process.

A typical chemical etching process uses photolithography, a photoresist mask, and a metal-dissolving liquid chemical to etch a pattern into the metal sheet that is being used to make leadframe 100. The liquid chemical etches away all portions of the metal sheet not masked by the photoresist mask, leaving behind the desired pattern that forms leadframe 100. The stamping process, on the other hand, uses a series of progressive dies to cut out portions of the metal sheet to create leadframe 100.

As mentioned above, there is a trend in the industry toward increasing the number of leads in a leadframe. There are several constraints that limit the number of leads that can be provided in a leadframe when made using the conventional methods described above. Using the example of FIG. 1, the overall size of leadframe 100, as well as the surface area taken up by die pad 106, are two such constraints. These elements are generally made as small as possible to minimize the footprint of the semiconductor package when complete. Another constraint is the space available within dam bar 102 for leads 104, which is directly related to the combination of the size of leadframe 100 and the surface area of die pad 106.

Two other constraints that limit the number of leads 104 in leadframe 100 are the width of inner end segments 104a, and the width of the spaces between inner end segments 104a. These widths are measured in what is herein referenced as the x-y plane (i.e. the plane that the leadframe substantially lies in). Minimizing these widths creates room for additional leads 104 to be provided in leadframe 100. Unfortunately, there is a limit to how much the width of inner end segments 104a can be minimized because the surface area of inner end segments 104a cannot go below a standard limit for the attachment of bond wires or other chip coupling means. Inner end segments 104a must allow for the space taken up by the bond wire or other chip coupling means, as well as allowing for tolerances in the bonding system.

The present invention provides for reducing the spacing between adjacent inner end segments 104a, and thereby achieves an increased density of leads 104, while maintaining the width of inner end segments 104a at a width appropriate for whatever types of conductor (e.g., bond wires) and conductor attaching equipment that are used to electrically connect inner end segments 104a to the semiconductor chip to be mounted on the leadframe. To achieve this objective, the conventional methods of forming inner end segments 104a must be discarded, since these methods leave considerable unused space between inner end segments 104a in the x-y plane.

In accordance with embodiments of the present invention, leads and inner end segments are provided where the spacing between inner end segments is substantially provided in the z-direction rather than in the x-y plane. As used herein, the z-direction refers to a direction that is normal to the x-y plane (i.e., normal to the surface of the leadframe). Accordingly, spacing between adjacent inner end segments 104a in the x-y plane can be substantially minimized or eliminated. This reduction of spacing in the x-y plane allows for a greater density of leads 104 in leadframe 100.

A leadframe constructed in accordance with one embodiment of the invention includes leads with inner end segments, where adjacent inner end segments have recesses formed on opposing surfaces. For instance, one inner end segment can have a recess formed on its top surface, while an adjacent inner end segment can have a recess formed on its bottom surface. This arrangement produces recesses on adjacent inner end segments that are oriented in opposite directions. Each recess can further have a depth that is greater than half the thickness of the lead and can extend to an inner end of the lead. Recesses configured as such create a gap between adjacent inner end segments in the z-direction, the gap being sufficient to electrically isolate adjacent inner end segments from one another. For that reason, spacing between adjacent inner end segments in the x-y plane is no longer required.

FIG. 2A is a perspective view of a portion of a leadframe 120 formed in accordance with an embodiment of the invention. Leadframe 120 includes a first subset of leads 200. Each lead 200 has an inner end segment 200a and an outer portion 200b between inner end segment 200a and dam bar 102 (not shown). Leadframe 120 also includes a second subset of leads 202. Each lead 202 has an inner end segment 202a and an outer portion 202b between inner end segment 202a and dam bar 102 (not shown). Inner end segments 200a and 202a extend a short distance outward from inner end 210 of the lead 200, 202, and have recesses 204 (labeled in FIGS. 2B and 2C) formed thereon. Accordingly, inner end segments 200a, 202a have a reduced vertical height relative to the remaining unrecessed outer portions 200b, 202b of leads 200, 202 (with the term "vertical" referring to the z-direction). More specifically, each inner end segment 200a has a recess 204 formed on a top surface 206 of lead 200, and each inner end segment 202a has a recess 204 formed on an opposite bottom surface 208 of lead 202. In FIGS. 2A–2C, recesses 204 extend to an inner end 210 of each lead 200 and 202.

FIG. 2B is a side view of a portion of lead 200 and inner end segment 200a. Lead 200 is shown with recess 204 formed inward from top surface 206, thereby reducing the vertical height of inner end segment 200a relative to the outward remainder of lead 200. Recess 204 extends through inner end 210 of lead 200. Bottom surface 208 of lead 200 is not recessed, but rather is a continuous plane across inner end segment 200a and outer portion 200b of the lead 200.

FIG. 2C is a side view of a portion of an adjacent lead 202 and inner end segment 202a. Lead 202 is shown with recess 204 formed inward from bottom surface 208, thereby reducing the vertical height of inner end segment 202a relative to the outward remainder of lead 202. As in FIG. 2B, recess 204 extends through inner end 210 of lead 202. Top surface 206 of lead 202 is not recessed, but rather is a continuous plane across inner end segment 202a and outer portion 202b of the lead 202.

Returning to FIG. 2A, individual leads 200 are situated in an alternating lateral pattern with individual leads 202. As a result, there are no leads 200 adjacent to other leads 200, and there are no leads 202 adjacent to other leads 202. Also illustrated in FIG. 2A are a portion of a down set rectangular die pad 212 and a tie bar 214 used for mounting die pad 212 to a dam bar (not shown). Die pad 212 and tie bar 214 (which is integrated with a corner of die pad 212) are not reduced in thickness, but rather have the same thickness as the unrecessed portion of leads 200, 202.

In an embodiment of the invention, inner end segments 200a and 202a have a width that is approximately equal to the standard limit for the attachment of bond wires or other chip coupling means. This standard limit only applies to inner end segments 200a and 202a, therefore, the unrecessed outer portion 200b, 202b of leads 200, 202 can have a width that is narrower than inner end segments 200a and 202a (see FIG. 3). This allows for spaces in the x-y plane between adjacent leads 200 and 202 so as to electrically isolate them from one another in a package.

Outer portions 200b, 202b of leads 200, 202 have a vertical height that corresponds to the thickness of the metal sheet used to form leadframe 100. This thickness is normally in the range of two to fifteen mils, typically around five or six mils. Inner end segments 200a and 202a, on the other hand, have a reduced vertical height due to recesses 204 formed in them. According to embodiments of the invention, the vertical height of inner end segments 200a and 202a can be less than half of the vertical height of the outer portions 200b, 202b of leads 200 and 202. In the embodiment of FIG. 2A, for example, inner end segments 200a and 202a have a vertical height that is approximately twenty to thirty percent of the vertical height of the outer portions 200b, 202b of the leads 200 and 202. So if outer portions 200b, 2002b of the leads 200 and 202 of FIG. 2A generally have a vertical height of approximately six mils, then inner end segments 200a and 202a can have a vertical height in the range of approximately one to two mils. In other embodiments of the invention, the height of inner end segments 200a and 202a can vary over a much wider range.

As shown in FIG. 2A and as mentioned above, leads 200 are arranged in an alternating lateral pattern with leads 202. Each inner end segment 200a is therefore adjacent only to one or two inner end segments 202a, and each inner end segment 202a is adjacent only to one or two inner end segments 200a. As a result, recesses 204 on adjacent inner end segments 200a and 202a are oriented in opposing directions. Since the vertical height of inner end segments 200a and 202a is less than half of the vertical height of outer portions 200b, 202b of the leads 200, 202, there is a gap between adjacent inner end segments 200a and 202a in the z-direction. This gap is sufficient to electrically isolate adjacent inner end segments 200a and 202a from one another in a package, thus eliminating the need for spacing between adjacent inner end segments 200a and 202a in the x-y plane.

In the embodiment shown in FIG. 2A, the gap created between adjacent inner end segments 200a and 202a in the z-direction is around one to four mils in length. This is calculated using the dimensions provided above, namely, outer portions 200b, 202b of the leads 200 and 202 being five to six mils in vertical height, and inner end segments 200a and 202a being one to two mils in vertical height. If the dimensions of leads 200 and 202 and inner end segments 200a and 202a were to vary, so too would the dimensions of the gap created between adjacent inner end segments 200a and 202a in the z-direction.

Practitioners will appreciate that, to create gaps in the z-direction, the vertical height of inner end segments 200a and 202a is desirably less than half of the vertical height of outer portions 200b, 202b of the leads 200 and 202. In other words, the vertical depth of recess 204 is more than half the vertical height of an unrecessed portion of lead 200, 202 between top surface 206 and bottom surface 208. If the vertical height of both of inner end segments 200a and 202a is greater than half of the vertical height of leads 200 and 202, adjacent inner end segments 200a and 202a could contact one another and will not be electrically isolated.

According to another embodiment of the invention, only one of inner end segment 200a or 202a can have a vertical height that is greater than half of the vertical height of lead 200 or 202. In this embodiment, the other of inner end segment 200a or 202a should have a vertical height that is small enough to still create a gap in the z-direction. This is necessary to allow adjacent inner end segments 200a and 202a to be electrically isolated from one another.

FIG. 2D is a front view of leads 200 and 202 of FIGS. 2A and 3 formed in FIG. 6 and viewed from inner end 210 of the lead 200, 202. FIG. 2D clearly demonstrates the spaces between adjacent outer lead portions 200b, 202b in the x-y plane, the gaps between inner end segments 200a and 202a in the z-direction, and the lack of space between inner end segments 200a and 202a in the x-y plane. Despite the lack of space between inner end segments 200a and 202a in the x-y plane, each of lead 200 with its corresponding inner end segment 200a is adapted to be electrically isolated from each adjacent of lead 202 and its respective inner end segment 202a in a package made using the leadframe.

FIG. 3 is a top plan view of leads 200 and 202 and inner end segments 200a and 202a from FIG. 2A. The absence of spacing between adjacent inner end segments 200a and 202a in the x-y plane is more evident in this top plan view. Again, this lack of spacing in the x-y plane is compensated for by the spacing provided in the z-direction. The minimization of x-y plane spacing allows additional leads 200 and 202 and wider inner end segments 200a and 202a to be included in leadframe 120, thereby increasing the density of leadframes constructed according to embodiments of the invention, while still allowing sufficient area for forming connections to the inner end segments of the leads.

Of course, while zero spacing is shown in FIG. 3 in the x-y plane between adjacent inner end segments 200a, 202a, an alternative embodiment may have some very small horizontal spacing between adjacent inner end segments 200a, 202a due, perhaps, to tolerances in the photolithography and etching processes or a design choice. Generally, however, the vertical, z-direction spacing between corresponding points on the recessed surfaces of adjacent inner end segments 200a, 202a will be greater than the horizontal spacing between the closest portions of the recessed surfaces of those adjacent inner end segments 200a, 202a. If necessary, horizontal spacing may be added by design to achieve required spacing between leads in a diagonal direction, thereby adding to the vertical spacing.

FIG. 4A is a perspective view of a portion of a leadframe 130 constructed according to another embodiment of the invention. In this embodiment, recesses 204 on inner end segments 202a are set back from inner ends 210 of leads 202, thereby forming pedestals 400 located at the respective inner ends 210 proximate to die pad 212. Pedestals 400 have the same vertical height as the unrecessed outer portions 202b of leads 202 outward of inner end segments 202a. To prevent contact with inner end segment 200a of the adjacent lead(s) 200, inner end segments 202a can extend further toward the center of leadframe 130 proximate to die pad 212 than inner end segments 200a. This allows pedestals 400 to be located in the x-y plane a distance away from inner end segment 200a of adjacent leads 200 to avoid contact and remain in electrical isolation in a package.

FIG. 4B is a side view of a portion of lead 200 and inner end segment 200a of FIG. 4A. Lead 200 is constructed similarly to lead 200 in FIG. 2A. FIG. 4C is a side view of a portion of lead 202 and inner end segment 202a of FIG. 4A. Lead 202 is constructed with recess 204 set back a selected outward distance from inner end 210, thus creating pedestal 400. As seen by a comparison of FIG. 4B to FIG. 4C, lead 202 can be longer than the adjacent lead(s) 200 so that inner end segment 202a extends inward further than inner end segment 200a. This prevents pedestal 400 from making contact with inner end segment 200a of the adjacent lead(s) 200.

A function of pedestal 400 is to provide mechanical support to inner end segment 202a during a wire bonding process. For instance, a wire bonding tool (not shown) sequentially pushes each inner end segment 200a and 202a downward against an underlying heater block when attaching bond wires thereto. Because inner end segments 202a of leads 202 of FIG. 2A are suspended above the heater block, they travel downward upon contact and may possibly become bent by the wire bonding tool. Pedestals 400 of FIG. 4A can provide inner end segments 202a with the mechanical support necessary to withstand this method of mounting bond wires, since downward travel of the lead 202 is minimized by pedestal 400. The result is a more robust wire bonding process. To provide maximum support, the wire bonding tool can attach the bond wire to inner end segment 202a directly on pedestal 400, thereby substantially reducing the downward travel of the lead 202.

FIG. 5 is a perspective view of a portion of a leadframe 140 constructed according to yet another embodiment of the invention. Here, the recess 204 in the inner end segment 200a of each lead 200 is set back from the inner end 210 of the lead 200, thereby forming a pedestal 500 located at inner end 210 of the lead 200 proximate to die pad 212. Like pedestals 400 of FIG. 4A, pedestals 500 generally have the same vertical height as outer portions 200b, 202b of leads 200 and 202a. To prevent pedestals 500 of inner end segments 200a from contacting adjacent inner end segments 202a, inner end segments 200a can extend further toward the center of leadframe 140 proximate to die pad 212 than inner end segments 202a so that they are spaced in the x-y plane. This maintains the electrical isolation of inner end segments 200a and 202a in a package.

The presence of pedestals 500 provides bonding surfaces for inner end segments 200a that are located in the same plane as inner end segments 202a. One use of the configuration of FIG. 5 is with a "flip chip" interconnection. A flip chip is a semiconductor chip that is mounted to leads without the use of bond wires. The active surface of the flip chip has a grid of solder balls or other contacts thereon that are used as its connectors. The solder balls or other contacts are placed directly into contact with pedestals 500 and inner end segments 202a, thereby bonding the flip chip to inner end segments 200a via pedestals 500, and to inner end segments 202a. Because a reflow process is typically used to create the bonds, mechanical support for inner end segments 202a is generally not required.

According to another embodiment of the invention (not shown), inner end segments of a third subset of alternating leads can be provided that include recesses formed on both a top surface and a bottom surface of the inner end segment. This results in an inner end segment that has a reduced vertical height relative to the outward remainder lead, and that is located approximately midway between the top surface and the bottom surface of the lead. The doubly-recessed inner end segment of this third subset of leads can be situated between adjacent inner end segments 200a and 202a of leads 200, 202 of FIG. 2A, thereby providing a three-tiered inner end segment structure. Provided that these inner end segments have a small enough vertical height, they will be electrically isolated from one another in a package by gaps provided in the z-direction.

The above-described leadframes may be formed from a metal sheet by an etching process in accordance with an embodiment of the invention. A single etching step is used, but for purposes of illustration, aspects of the single process are shown in FIGS. 6A–C and 7A–C. For this example, the object is to make the leadframe of FIGS. 2A–C and 3.

Generally, a photoresist mask is formed on both of the opposed top and bottom surfaces of a metal sheet 606 (see FIGS. 6A and 7A). Referring to FIGS. 2A and 3, the photoresist mask portions 700 for forming the recessed inner end segments 200a, 202a of leads 200, 202 are shown in FIG. 7A, and the photoresist mask portions 600 for forming the relatively narrower outer portions 200b, 202b of the leads 200, 202 are shown in FIG. 6A. Other portions of the opposing photoresist masks, which portions are not shown, mask metal that will form die pad 212, tie bars 214, and the dam bars of the leadframe 120.

Note that the mask portions 700 on upper surface 602 of sheet 606 of FIG. 7A for forming inner end segments 202a do not, or do not substantially, overlap the mask portions 700 on second surface 604 of sheet 606 for forming inner end segments 200a. Accordingly, alternating portions of top surface 602 and bottom surface 604 of sheet 606 are exposed for an etching step that is shown in FIG. 7B. Also note that the mask portions 600 on top surface 602 of sheet 606 of FIG. 6A each superimpose a corresponding mask portion 600 on bottom surface 604 of sheet 606, and that adjacent regions of sheet 606 are exposed at both top surface 602 and bottom surface 604. Accordingly, the x-y plane space between the outer portions 200b, 202b of the leads 200, 202 is formed by through etching from both top surface 602 and bottom surface 604 of sheet 606, as is illustrated in the etching step of FIG. 6B.

FIGS. 8 and 9 provide plan views of the respective photoresist masks formed on upper surface 602 and lower surface 604 of sheet 606, including the portions 600 that mask the portions of sheet 606 that become outer portions 200b, 202b and the portions 700 that mask the portions of sheet 606 that become inner end segments 200a, 202a of the leads.

In the exemplary etching step illustrated in FIGS. 6B and 7B, the etching is conducted until something more than half (e.g., 70–80%) of the metal of the unmasked regions of FIG. 7A is removed inward from top surface 602 or bottom surface 604, as the case may be. Accordingly, alternating inner end segments 200a, 202a are formed that are spaced in the z-direction without being spaced, or without being substantially spaced, in the x-y direction (see FIGS. 2A and 3). Meanwhile, metal sheet 606 is etched completely through in the regions between mask portions 600 of FIG. 6A, thereby forming outer portions 200b, 202b of the leads 200, 202. Adjacent outer portions 200b, 202b are spaced in the x-y plane, but not the z-direction.

Subsequently, as illustrated in FIGS. 6C and 7C, the photoresist masks are removed from opposed surfaces 602, 604 of sheet 606. The partial-etch process of this method yields inner end segments 200a and 202a that are arranged in an alternating fashion with recesses 204 that separate them in the z-direction but not in the x-y plane. In an additional step that is generally performed, a layer of silver, gold, palladium, nickel, or the like can be plated to inner end segments 200a and 202a to aid in a later process of electrically connecting (e.g., by bond wire attachment) a semiconductor chip to inner end segments 200a and 202a.

The leads 200 and 202 of FIGS. 4A and 5 may be formed by making a minor change in the photoresist masking patterns discussed above. For example, FIGS. 10 and 11 are plan views of opposed photoresist masks on a sheet 606 (FIGS. 6A, 7A) used to form the leads 200 and 202 of FIG. 4A. In FIG. 10, the photoresist mask includes portions 600 that are used to mask outer lead portions 200b, 202b, and portions 700 used to mask inner end segments 202a. In FIG. 11, the photoresist mask includes portions 600 that are used to mask outer lead portions 200b, 202b, and portions 700 used to mask inner end segments 200a. Note that, to form pedestals 400 (FIG. 4A) on at the inner end of leads 202, the mask 700 for the inner end segment 202a extends further toward the center of the sheet, and an island of masking material 1100 is formed on bottom surface 604 (FIG. 7A) of sheet 606.

FIG. 12A is a sectional diagram of an exemplary semiconductor package 1400 that includes leadframe 120 of FIG. 2A. Practitioners will appreciate that a wide variety of leadframes can be made in view of the teachings herein, and that a wide variety of packages can be made with such leadframes. Accordingly, package 1400 is just an example.

Semiconductor package 1400 includes a semiconductor chip 1402 mounted on metal die pad 212 using an adhesive layer 1403. Die pad 212 is downset from leads 200 and 202. Chip 1402 has a plurality of bond pads 1404 that are electrically coupled to inner end segments 200a and 202a via a plurality of bond wires 1406. In other embodiments, this electrical coupling can be facilitated by conductors other than bond wires 1406.

In the semiconductor package 1400, inner end segments 200a, 202a of the leads 200, 202 may be formed according to the above-described photolithography and etching process, among other possibilities. Therefore, adjacent inner end segments 200a and 202a are separated from one another by gaps in the z-direction, and are not substantially separated in the x-y plane.

Semiconductor package 1400 also includes an insulative encapsulant 1408 that fills in and around die pad 212, chip 1402, bond wires 1406, inner end segments 200a and 202a, and outer portions 200b and 2002b of leads 200 and 202. Encapsulant 1408 is typically a nonconductive polymer (e.g., an epoxy-based resin) that is injection or transfer molded over the leadframe 120 within the dam bar (not shown) of the leadframe, and then cured. The dam bar is removed to electrically isolate the leads. Typically, individual packages are singulated from a strip of leadframes that are processed as a group. The laterally extending outer, unencapsulated portions (if any) of leads 200, 202 may be bent into a variety of configurations, such as gull wing or J-lead configurations during a trim and form operation.

Leadframes 130 and 140 of FIGS. 4A and 5, respectively, may be provided in packages similar to package 1400 of FIG. 12A. In a package 1410 made with leadframe 130 or 140, as shown in FIG. 12B, the semiconductor chip 1402 is mounted one inner end segments 200a, 202a in a flip chip style using solder balls 1412.

Unlike previously developed metal patterning techniques, in which a substantial amount of unused space was left between lead inner end segments in the x-y plane, the partial-etching technique of the present invention provides adjacent lead inner end segments with spacing in the z-direction rather than in the x-y plane. This reduction of or elimination of spacing in the x-y plane between adjacent lead inner end segments allows a higher lead density in the leadframe and in the package made with the leadframe.

While various embodiments of the invention have been shown and described, it will be apparent to practitioners that numerous alterations may be made without departing from the inventive concepts presented herein. Thus, the invention is not to be limited except in accordance with the following claims and their equivalents.

What is claimed is:

1. A leadframe comprising:
   a plurality of leads, each lead comprising a first surface, an opposite second surface, an inner end segment which defines an inner end of the lead, and an outer portion extending from the inner end segment,
   wherein a first subset of the leads each include a recess in the first surface of the lead at the inner end segment, a second subset of the leads each include a recess in the second surface of the lead at the inner end segment, and the individual leads of the first subset are situated in an alternating lateral pattern with the individual leads of the second subset such that the recesses in the inner end segments of the leads of any pair of adjacent leads are oriented in opposite directions, the inner end segments of the leads of the second subset each including a pedestal between the inner end of the lead and the recess.

2. The leadframe of claim 1, wherein the recess of the inner end segment of each of the leads of the first subset extends to the inner end of the lead, and the leads of the second subset extend further toward a center of the leadframe than the leads of the first subset.

3. The leadframe of claim 1, wherein the inner end of each of the leads is of a first width, and at least a portion of the outer portion of each of the leads is of a second width which is less than the first width.

4. The leadframe of claim 1, wherein each recess has a vertical depth that is more than half of a vertical height of the lead.

5. The leadframe of claim 1, further comprising a plurality of electrical conductors, wherein the inner end segments are respectively electrically connected to a semiconductor chip by one of said plurality of electrical conductors.

6. The leadframe of claim 5, where at least some of the plurality of electrical conductors are respectively electrically connected within the recess of the respective inner end segment.

7. A leadframe comprising:
a plurality of pairs of adjacent metal leads, wherein each lead includes opposite first and second surfaces, an inner end segment which defines an inner end of the lead and has a recessed surface, and an outer portion extending from the inner end segment, and
wherein the recessed surfaces of the leads of each said pair of adjacent leads are oriented in opposite directions and spaced apart a first distance in a vertical direction, and said first distance is greater than a second distance in a horizontal direction between closest portions of the recessed surfaces of the leads of each said pair of adjacent leads, one lead of each said pair including a pedestal between the inner end of the lead and the recessed surface which projects downwardly away from the first surface thereof.

8. The leadframe of claim 7, wherein the first distance is greater than half a vertical height of an unrecessed portion of the lead.

9. The leadframe of claim 7, wherein the second distance is approximately zero.

10. The leadframe of claim 9, wherein the second distance is zero.

11. The leadframe of claim 7, further comprising a plurality of electrical conductors, wherein the inner end segments of the leads are respectively electrically connected to a semiconductor chip by one of said plurality of electrical conductors, and at least some of said plurality of electrical conductors are connected to the recessed surface of the respective inner end segment.

12. The leadframe of claim 7, further comprising a dam bar connected to the outer segments of the leads.

13. A leadframe comprising:
a plurality of adjacent pairs of leads each including opposite first and second surfaces, an inner segment which defines an inner end of the lead and has a recessed surface, and an outer portion extending from the inner segment, the recessed surfaces of the inner end segments of the leads of each of the pairs being oppositely oriented, with one lead of each said pair including a pedestal between the inner end of the lead and the recessed surface which projects downwardly away from the first surface thereof.

14. The leadframe of claim 13, further comprising a plurality of electrical conductors, wherein the inner end segments of the pairs of adjacent leads are respectively electrically connected to a semiconductor chip by one of said plurality of electrical conductors, and at least some of said plurality of electrical conductors are connected to the recessed surface of the respective inner end segment.

15. The leadframe of claim 13, wherein the inner end segment of each of the leads is of a first width, and at least a portion of the outer portion of each of the leads is of a second width which is less than the first width.

16. A semiconductor package comprising:
a plurality of adjacent pairs of leads each including opposite first and second surfaces, an inner segment which defines an inner end of the lead and has a recessed surface, and an outer portion extending from the inner segment, the recessed surfaces of the inner end segments of the leads of each of the pairs being oppositely oriented, with one lead of each said pair including a pedestal between the inner end of the lead and the recessed surface which projects downwardly away from the first surface thereof;
a semiconductor chip in an electrical connection with the inner end segments of the leads; and
a hardened encapsulant material covering the semiconductor chip, and the inner end segments of the leads.

17. The semiconductor package of claim 16, wherein the electrical connection comprises a plurality of electrical connectors bonded between the semiconductor chip and the inner end segments, wherein at least some of said plurality of electrical conductors are bonded to the recessed surface of the respective inner end surface.

18. The semiconductor package of claim 16, wherein the inner end segment of each of the leads is of a first width, and at least a portion of the outer portion of each of the leads is of a second width which is less than the first width.

19. A semiconductor package comprising:
a plurality of pairs of adjacent metal leads, wherein each lead includes opposite first and second surfaces, an inner end segment which defines an inner end of the lead and has a recessed surface, and an outer portion extending from the inner end segment, and
wherein the recessed surfaces of the leads of each said pair of adjacent leads are oriented in opposite directions and spaced apart a first distance in a vertical direction, and said first distance is greater than a second distance in a horizontal direction between closest portions of the recessed surfaces of the leads of each said pair of adjacent leads, with one lead of each said pair including a pedestal between the inner end of the lead and the recessed surface which projects downwardly away from the first surface thereof;
a semiconductor chip in an electrical connection with the inner end segments of the leads; and
a hardened encapsulant material covering the semiconductor chip, the conductors, and the inner end segments of the leads.

20. The semiconductor package of claim 19, wherein the first distance is greater than half a vertical height of an unrecessed portion of the lead.

21. The semiconductor package of claim 19, wherein the second distance is approximately zero.

22. The semiconductor package of claim 19, wherein the electrical connection comprises a plurality of metal wires bonded between the semiconductor chip and the inner end segments, wherein at least some of said wires are bonded to the recessed surface of the respective inner end segment.

23. The leadframe of claim 1, wherein the inner ends of the leads of the second subset extend further toward a center of the leadframe than the inner ends of the leads of the second first subset.

24. The leadframe of claim 1, wherein the recess of each of the leads of the first subset of the leads extends to the inner end of the lead.

25. The leadframe of claim 7, wherein the inner end of the lead of each said pair which includes the pedestal extends further toward a center of the leadframe than the inner end of the other lead of the pair.

26. The leadframe of claim 7, wherein the recessed surface of the lead of the pair which does not include the pedestal extends to the inner end of the lead.

27. The leadframe of claim 26, wherein the inner end of the lead of each said pair which includes the pedestal extends further toward a center of the leadframe than the inner end of the other lead of the pair which does not include the pedestal.

28. The leadframe of claim 13, wherein the inner end of the lead of each said pair which includes the pedestal extends further toward a center of the leadframe than the inner end of the other lead of the pair which does not include the pedestal.

29. The leadframe of claim 13, wherein the recessed surface of the lead of the pair which does not include the pedestal extends to the inner end of the lead.

30. The leadframe of claim 29, wherein the inner end of the lead of each said pair which includes the pedestal extends further toward a center of the leadframe than the inner end of the other lead of the pair which does not include the pedestal.

31. The semiconductor package of claim 16, wherein the inner end of the lead of each said pair which includes the pedestal extends further toward the semiconductor chip than the inner end of the other lead of the pair which does not include the pedestal.

32. The semiconductor package of claim 16, wherein the recessed surface of the lead of the pair which does not include the pedestal extends to the inner end of the lead.

33. The semiconductor package of claim 32, wherein the inner end of the lead of each said pair which includes the pedestal extends further toward the semiconductor chip than the inner end of the other lead of the pair.

34. The semiconductor package of claim 32, wherein the electrical connection to the lead of the pair having the pedestal is located at the pedestal.

35. The semiconductor package of claim 19, wherein the recessed surface of the lead of the pair which does not include the pedestal extends to the inner end of the lead.

36. The semiconductor package of claim 35, wherein the inner end of the lead of each said pair which includes the pedestal extends further toward the semiconductor chip than the inner end of the other lead of the pair.

37. The semiconductor package of claim 19, wherein the inner end of the lead of each said pair which includes the pedestal extends further toward the semiconductor chip than the inner end of the other lead of the pair which does not include the pedestal.

* * * * *